(12) United States Patent
Kang et al.

(10) Patent No.: US 7,893,738 B2
(45) Date of Patent: Feb. 22, 2011

(54) DLL CIRCUIT

(75) Inventors: Yong-Gu Kang, Ichon (KR); Yong-Mi Kim, Ichon (KR)

(73) Assignee: Hynix Semiconductor Inc. (KR)

( * ) Notice: Subject to any disclaimer, the term of this patent is extended or adjusted under 35 U.S.C. 154(b) by 92 days.

(21) Appl. No.: 12/170,243

(22) Filed: Jul. 9, 2008

(65) Prior Publication Data

US 2009/0091363 A1    Apr. 9, 2009

(30) Foreign Application Priority Data

Oct. 9, 2007    (KR)    ............... 10-2007-0101627

(51) Int. Cl.
    H03L 7/06    (2006.01)
(52) U.S. Cl. .................... 327/158; 327/149
(58) Field of Classification Search .......... 327/147, 327/158
    See application file for complete search history.

(56) References Cited

U.S. PATENT DOCUMENTS

| | | | | |
|---|---|---|---|---|
| 5,304,954 | A * | 4/1994 | Saito et al. ................ 331/1 A |
| 7,154,344 | B2 * | 12/2006 | Thies et al. ................ 331/16 |
| 7,190,202 | B1 | 3/2007 | Oh et al. |
| 7,298,218 | B2 * | 11/2007 | Ghazali et al. ............. 331/16 |
| 7,368,963 | B2 | 5/2008 | Lee |
| 7,368,964 | B2 | 5/2008 | Kim et al. |
| 7,372,339 | B2 * | 5/2008 | Fu ............................ 331/16 |
| 7,511,579 | B2 * | 3/2009 | Wang et al. ................ 331/16 |
| 7,616,066 | B2 * | 11/2009 | Ishii et al. .................. 331/16 |
| 2004/0212400 | A1 | 10/2004 | Watanabe et al. |
| 2005/0275473 | A1 * | 12/2005 | Thies et al. ................ 331/34 |
| 2007/0120612 | A1 * | 5/2007 | Fu ............................ 331/34 |
| 2007/0210841 | A1 | 9/2007 | Kim |
| 2008/0001640 | A1 * | 1/2008 | Choi ......................... 327/158 |
| 2008/0054947 | A1 * | 3/2008 | Choi ......................... 327/12 |
| 2008/0191773 | A1 * | 8/2008 | Oh ............................ 327/276 |
| 2009/0284318 | A1 * | 11/2009 | Machado ................... 331/16 |
| 2010/0085091 | A1 * | 4/2010 | Strazzieri et al. .......... 327/157 |
| 2010/0134162 | A1 * | 6/2010 | Kondou ..................... 327/157 |

FOREIGN PATENT DOCUMENTS

| | | |
|---|---|---|
| JP | 2000-124796 | 4/2000 |
| JP | 2003-045183 | 2/2003 |
| KR | 1020010091534 A | 10/2001 |
| KR | 1020030002130 A | 1/2003 |
| KR | 1020040023838 A | 3/2004 |

* cited by examiner

*Primary Examiner*—Lincoln Donovan
*Assistant Examiner*—Adam D Houston
(74) *Attorney, Agent, or Firm*—Baker & McKenzie LLP

(57) ABSTRACT

A DLL circuit including a first clock signal dividing block configured to selectively divide a frequency of a reference clock signal according to whether a lock completion signal is enabled, a phase comparing block configured to generate a phase comparison signal by comparing phases of a clock signal transmitted from the first clock signal dividing block with a feedback clock signal, and an operation mode setting block configured to generate the lock completion signal in response to the phase comparison signal is described herein.

6 Claims, 5 Drawing Sheets

DLL CIRCUIT

CROSS-REFERENCES TO RELATED PATENT APPLICATION

This application claims the benefit under 35 U.S.C 119(a) to Korean Application No. 10-2007-0101627, filed on Oct. 9, 2007, in the Korean Intellectual Property Office, the disclosure of which is incorporated herein by reference in its entirety as if set forth in full.

BACKGROUND

1. Technical Field

The embodiments described herein relate to a semiconductor integrated circuit, and more particularly a Delay Locked Loop (DLL) circuit for generating an internal clock of a semiconductor integrated circuit.

2. Related Art

A conventional DLL circuit provides an internal clock signal having a phase that leads the phase of a reference clock signal obtained by converting an external clock signal. The DLL circuit is used to solve a problem in that as an internal clock signal used in a semiconductor integrated circuit is delayed through a clock signal buffer and a transmission line, a phase difference appears between the internal clock signal and the external clock signal. As a result, an output data access time becomes longer. The DLL circuit controls the internal clock signal such that the phase of the internal clock signal appears at a predetermined time prior to the external clock signal to increase an effective data output section.

Recently, the processing speed of semiconductor integrated circuits has been increased and clock signals having a high frequency have been correspondingly used. Accordingly, a DLL circuit should be able to receive a high-frequency external clock signal and output a high-frequency internal clock signal. The higher the frequency of each clock signal that is output through each element in the DLL circuit, the less the wave form is distorted or is not preferably toggled. When each clock signal inside is abnormally generated, the DLL circuit cannot easily perform the primary function of comparing the phases of a reference clock signal and a feedback clock signal and giving a delay time to the reference clock signal on the basis of the compared result. As a result, by using a high-frequency clock signal, the stability of DLL circuit decreases.

Further, by using the high-frequency clock signal, the amount of peak current is increased in the DLL circuit and power consumption is correspondingly increased. The conventional DLL circuit continues comparing phases and delay-controlling using the high-frequency clock signal after delay lock is completed, and accordingly, power consumption is considerably increased. As a result, it is difficult to manufacture a semiconductor integrated circuit that can be operated by low power due to the large amount of power consumption.

SUMMARY

A DLL circuit that can improve stability even though high-frequency clock signals are used is described herein. A DLL circuit that reduces power consumption even though a high-frequency clock signal is used is also described.

According to one aspect, a DLL circuit can include a first clock signal dividing block which can be configured to selectively divide a frequency of a reference clock signal according to whether a lock completion signal is enabled, a phase comparing block that can be configured to generate a phase comparison signal by comparing phases of a clock signal transmitted from the first clock signal dividing block with a feedback clock signal, and an operation mode setting block which can be configured to generate the lock completion signal in response to the phase comparison signal.

According to another aspect, a DLL circuit can include a first clock signal dividing block that can be configured to selectively divide a frequency of a delay clock signal according to whether a lock completion signal is enabled; a delay compensating block which can be configured to generate a feedback clock signal by delaying a clock signal transmitted from the clock signal dividing block, for a predetermined time; and an operation mode setting block configured to generate the lock completion signal according to information of phases of a reference clock signal and the feedback clock signal.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Figure 1:
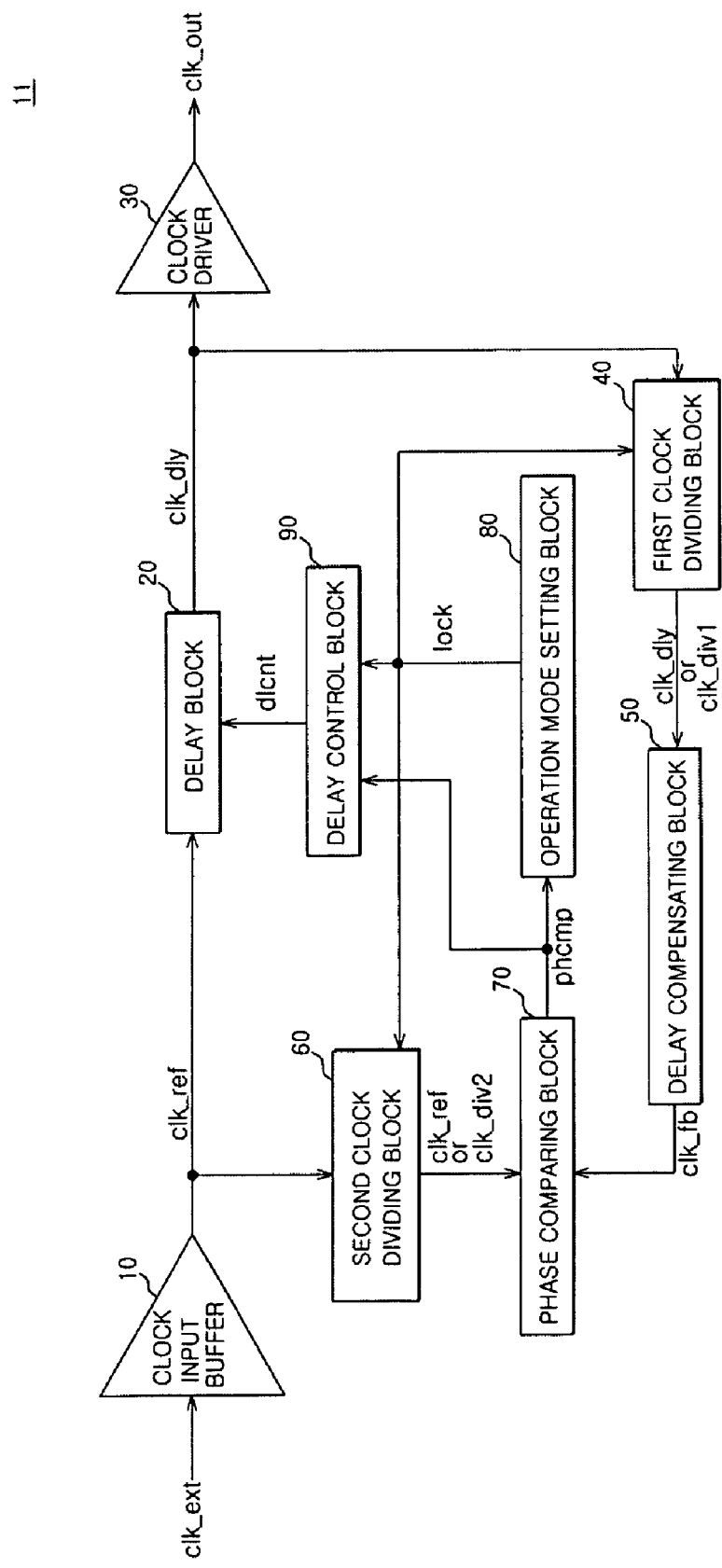
FIG. 1 is a block diagram illustrating a configuration of a DLL circuit according to an embodiment described herein.

FIG. 1 is a block diagram illustrating a configuration of a DLL circuit 11 according to an embodiment described herein. Referring to FIG. 1, the DLL circuit 11 can include a clock signal input buffer 10, a delay block 20, a clock signal driver 30, a first clock signal dividing block 40, a delay compensating block 50, a second clock signal dividing block 60, a phase comparing block 70, an operation mode setting block 80, and a delay control block 90.

The clock signal input buffer 10 can generate a reference clock signal "clk_ref" by buffering an external clock signal "clk_ext". The delay block 20 can generate a delay clock signal "clk_dly" by delaying the reference clock signal "clk_ref" in response to a delay control signal "dlcnt". The clock signal driver 30 can generate an output clock signal "clk_out" by driving the delay clock signal "clk_dly". The first clock signal dividing block 40 can selectively divides a frequency of the delay clock signal "clk_dly" according to whether a lock completion signal "lock" is enabled. The delay compensating block 50 can generate a feedback clock signal "clk_fb" by giving a delay time obtained by modeling the amount of delay of an output path of the delay clock signal "clk_dly" to an output clock signal of the first clock signal dividing block 40.

The second clock signal dividing block 60 can selectively divide a frequency of the reference clock signal "clk_ref" according to whether the lock completion signal "lock" is enabled. The phase comparing block 70 can generate a phase comparison signal "phcmp" by comparing the phases of the output clock signal of the second clock signal dividing block 60 and the feedback clock signal "clk_fb". The operation mode setting block 80 can generate the lock completion signal "lock" in response to the phase comparison signal "phcmp". The delay control block 90 can generate the delay control signal "dlcnt" in response to phase comparison signal "phcmp" and the lock completion signal "lock".

The first clock signal dividing block 40 can transmit the delay clock signal "clk_dly" to the delay compensating block 50, when the lock completion signal "lock" is disabled. The first clock signal dividing block 40 can generate a first divide clock signal "clk_div1" by dividing the frequency of the delay clock signal "clk_dly" according to a predetermined divide ratio and can transmit the first divide clock signal "clk_div1" to the delay compensating block 50, when the lock completion signal "lock" is enabled.

The second clock signal dividing block 60 can transmit the reference clock signal "clk_ref" to the phase comparing block 70, when the lock completion signal "lock" is disabled. The second clock signal dividing block 60 can generate a second divide clock signal "clk_div2" by dividing the frequency of the reference clock signal "clk_ref" according to a predetermined divide ratio and can transmit the second divide clock signal "clk_div2" to the phase comparing block 70, when the lock completion signal "lock" is enabled.

The DLL circuit can include both of the first clock signal dividing block 40 and the second clock signal dividing block 60 herein, but it should be understood that a DLL circuit can include just one of the two clock signal dividing blocks as well.

According to the above configuration, the frequency of the feedback clock signal "clk_fb" that can be output from the delay compensating block 50 is lower when the lock completion signal "lock" is enabled than when the lock completion signal "lock" is disabled.

The phase comparing block 70 can generate the phase comparison signal "phcmp" by comparing the phases of the reference clock signal "clk_ref" and the feedback clock signal "clk_fb", when the lock completion signal "lock" is disabled. The phase comparing block 70 can generate the phase comparison signal "phcmp" by comparing the phases of the reference clock signal "clk_ref" and the second divide clock signal "clk_div2", when the lock completion signal "lock" is enabled. Because the frequencies of the reference clock signal "clk_ref" and the second divide clock signal "clk_div2" are different but the phases are not different, the phase comparing block 70 can be easily achieved from a common phase comparator.

The operation mode setting block 80 can receive information about a relationship of the phases of the reference clock signal "clk_ref" and the feedback clock signal "clk_fb" from the phase comparison signal "phcmp" at the initial operation. When the phase difference of the reference clock signal "clk_ref" and the feedback clock signal "clk_fb" exceeds a predetermined range, the operation mode setting block 80 can instruct a coarse lock mode operation to the delay control block 90 and the delay block 20 while keeping the lock completion signal "lock" disabled. Thereafter, when the phase difference of the reference clock signal "clk_ref" and the feedback clock signal "clk_fb" decreases under the predetermined range, the operation mode setting block 80 can instruct a fine lock mode operation to the delay control block 90 and the delay block 20 while enabling the lock completion signal "lock".

The delay control block 90 can change the logic value of the delay control signal "dlcnt" such that the coarse delay time that is given to the reference clock signal "clk_ref" from the delay block 20 is changed, when the lock completion signal "lock" is disabled. The delay control block 90 can lock the logic value of the delay control signal "dlcnt" such that the delay block 20 can give a locked coarse delay time to the reference clock signal "clk_ref", when the lock completion signal "lock" is enabled.

As described above, the DLL circuit, according to an embodiment described herein, before the delay lock is completed, can reduce the time taken until the delay lock is completed, by comparing the phases of the high-frequency reference clock signal "clk_ref" and the feedback clock signal "clk_fb". When the delay lock is completed, the DLL circuit can decrease power consumption and increase stability by comparing the phases of low-frequency clock signals having frequencies divided from the reference clock signal "clk_ref" and the feedback clock signal "clk_fb".

Figure 2A:
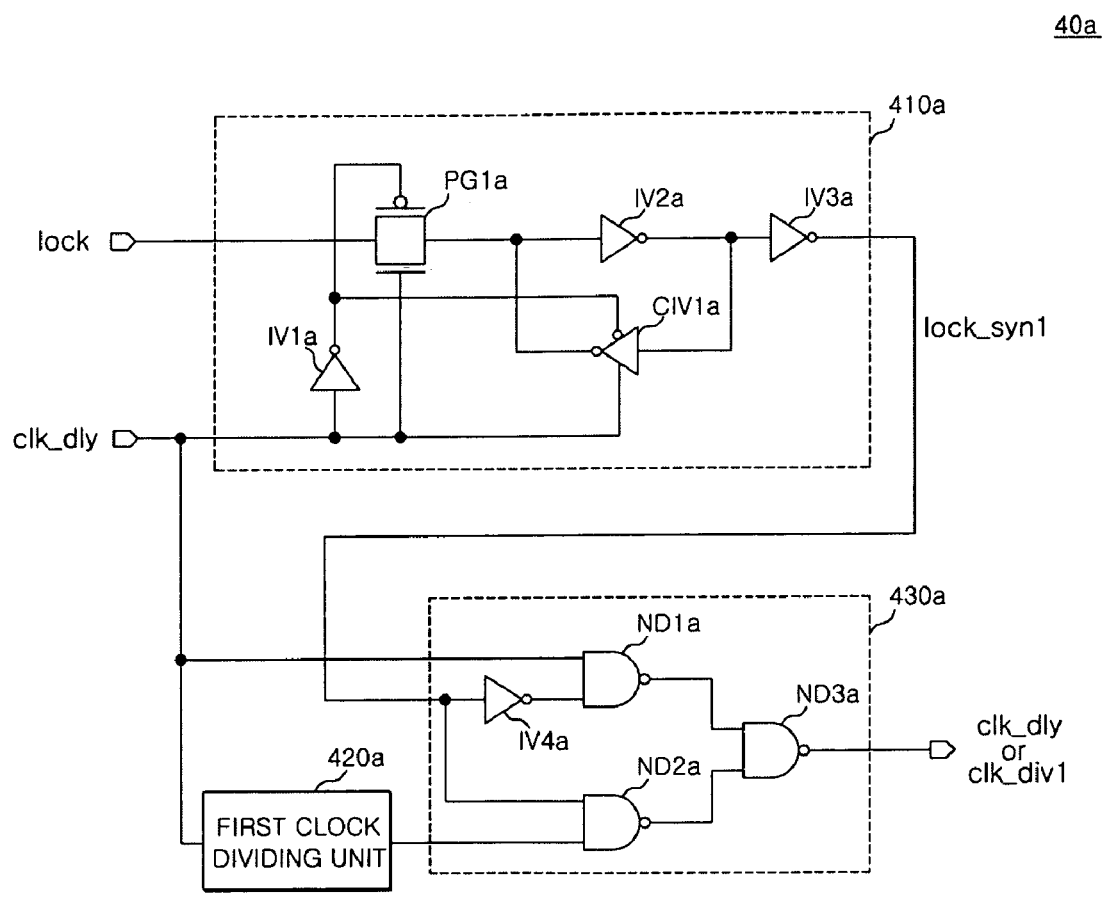
FIG. 2A is a first exemplary view illustrating a detailed configuration of a first clock signal dividing block that can be included in the diagram illustrated in FIG. 1.

Referring to FIG. 2A, a first exemplary view of the first clock signal dividing block 40, a first clock signal dividing block 40a can include a first clock signal synchronizing unit 410a, a first clock signal dividing unit 420a, and a first switching unit 430a.

The first clock signal synchronizing unit 410a can generate a first clock signal synchronization lock completion signal "lock_syn1" by synchronizing the lock completion signal "lock" with the delay clock signal "clk_dly". The first clock signal synchronizing unit 410a can include a first inverter IV1a, a second inverter IV2a, a third inverter IV3a, a first pass gate PG1a, and a first control inverter CIV1a.

The delay clock signal "clk_dly" can be input into the first inverter IV1a. The first pass gate PG1a can allow the lock completion signal "lock" to pass through, in response to the delay clock signal "clk_dly" and an output signal of the first inverter IV1a. The second inverter IV2a can receive an output signal of the first pass gate PG1a. The first control inverter CIV1a can operate in response to the delay clock signal "clk_dly" and the output signal of the first inverter IV1a and can form a latch structure together with the second inverter IV2a. The third inverter IV3a can receive an output signal of the second inverter IV2a and can output the first clock signal synchronization lock completion signal "lock_syn1".

The first clock signal dividing unit 420a can generate the first dividing clock signal "clk_div1" by dividing the frequency of the delay clock signal "clk_dly" according to a predetermined divide ratio. The first clock signal dividing unit 420a can be implemented from a common clock signal dividing unit. The frequency ratio of the first dividing clock signal "clk_div1" and the delay clock signal "clk_dly" can be adjusted by changing the configuration of the first clock signal dividing unit 420a.

The first switching unit 430a can selectively output the delay clock signal "clk_dly" or the first dividing clock signal "clk_div1" according to whether the first clock signal synchronization lock completion signal "lock_syn1" is enabled. The first switching unit 430a can include a fourth inverter IV4a, a first NAND gate ND1a, a second NAND gate ND2a, and a third NAND gate ND3a.

The first clock signal synchronization lock completion signal "lock_syn1" can be input into the fourth inverter IV4a. The first NAND gate ND1a can receive an output signal of the fourth inverter IV4a and the delay clock signal "clk_dly". The second NAND gate ND2a can receive the first clock signal synchronization lock completion signal "lock_syn1" and the first dividing clock signal "clk_div1". The third NAND gate ND3a can receive an output signal of the first NAND gate ND1a and an output signal of the second NAND gate ND2a.

According to this configuration, the first clock signal synchronization lock completion signal "lock_syn1" output from the first clock signal synchronizing unit 410a can be synchronized at a rising edge of the delay clock signal "clk_dly", and thus the level transits. The third NAND gate ND3a of the first switching unit 430a can output the delay clock signal "clk_dly" when the first clock signal synchronization lock completion signal "lock_syn1" is disabled, and can output the first dividing clock signal "clk_div1" when the first clock signal synchronization lock completion signal "lock_syn1" is enabled.

Figure 2B:
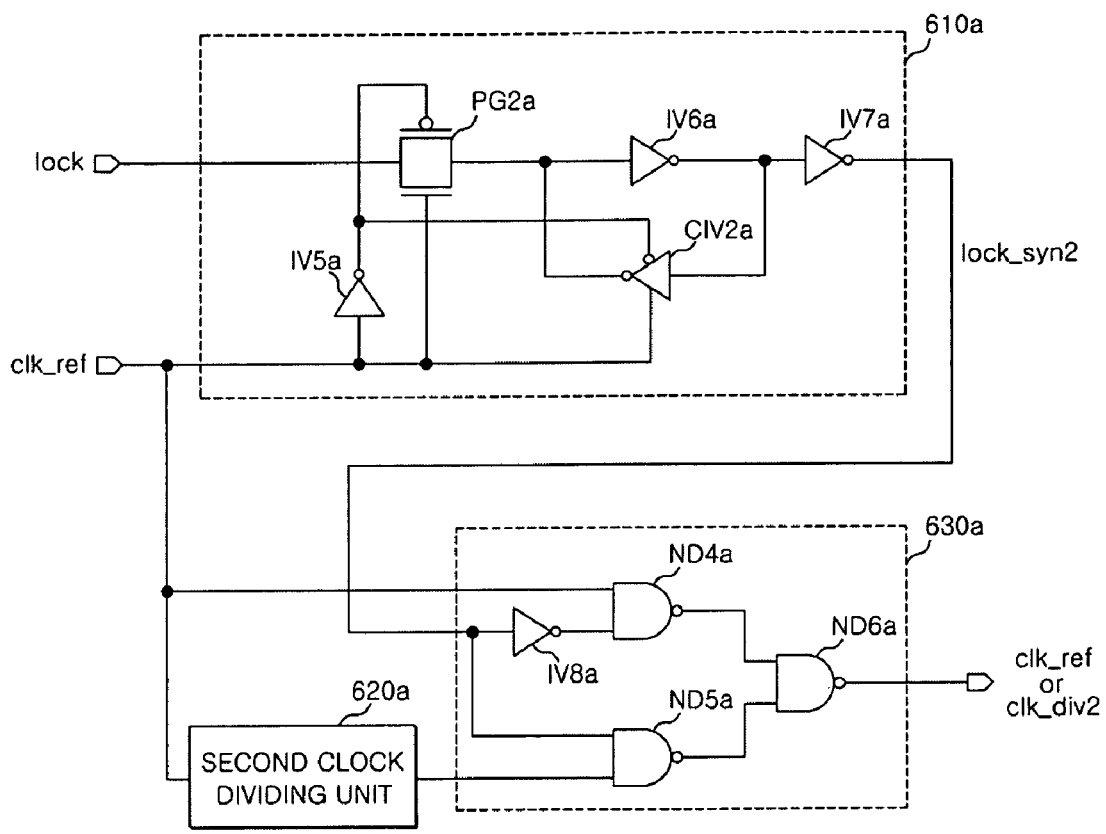
FIG. 2B is a first exemplary view illustrating a detailed configuration of a second clock signal dividing block that can be included in the diagram illustrated in FIG. 1.

Referring to FIG. 2B, a first exemplary view of the second clock signal dividing block 60, a second clock signal dividing block 60a can include a second clock signal synchronizing unit 610a, a second clock signal dividing unit 620a, and a second switching unit 630a, and can have a configuration and operation similar to the first clock signal dividing block 40a.

The second clock signal synchronizing unit 610a can generate a second clock signal synchronization lock completion signal "lock_syn2" by synchronizing the lock completion signal "lock" with the reference clock signal "clk_ref". The second clock signal synchronizing unit 610a can include a fifth inverter IV5a, a sixth inverter IV6a, a seventh inverter IV7a, a second pass gate PG2a, and a second control inverter CIV2a.

The second clock signal dividing unit 620a can generate the second divide clock signal "clk_div2" by dividing the frequency of the reference clock signal "clk_ref" according to a predetermined divide ratio. The second clock signal dividing unit 620a can be implemented from a common clock signal dividing unit. The frequency ratio of the second divide clock signal "clk_div2" and the reference clock signal "clk_ref" can be adjusted by changing the configuration of the second clock signal dividing unit 620a.

The second switching unit 630a can selectively output the reference clock "clk_ref" or the second divide clock signal "clk_div2" according to whether the second clock signal synchronization lock completion signal "lock_syn2" is enabled. The second switching unit 630a can include an eighth inverter IV8a, a fourth NAND gate ND4a, a fifth NAND gate ND5a, and a sixth NAND gate ND6a.

According to this configuration, the second clock signal synchronization lock completion signal "lock_syn2" that can be output from the second clock signal synchronizing unit 610a can be synchronized at a rising edge of the reference clock signal "clk_ref", and thus the level can transit. The sixth NAND gate ND6a of the second switching unit 630a can output the reference clock signal "clk_ref" when the second clock signal synchronization lock completion signal "lock_syn2" is disabled, and can output the second divide clock signal "clk_div2" when the second clock signal synchronization lock completion signal "lock_syn2" is enabled.

Figure 3A:
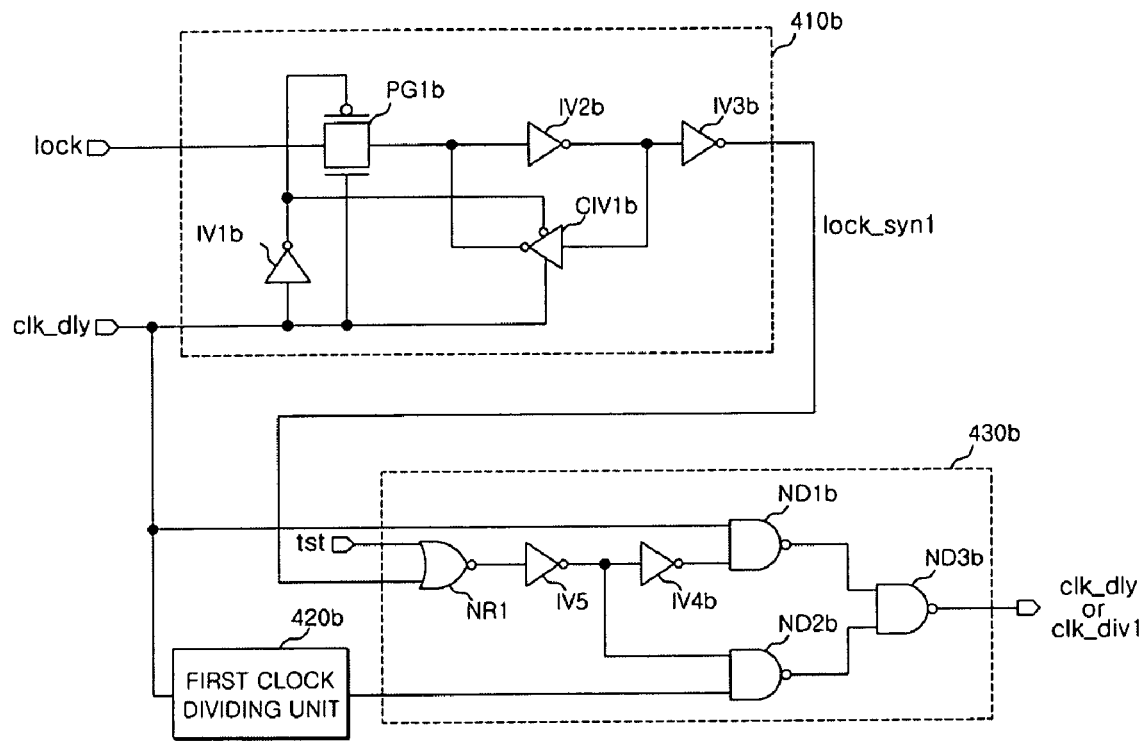
FIG. 3A is a second exemplary view illustrating a detailed configuration of the first clock signal dividing block that can be included in the diagram illustrated in FIG. 1.

Referring to FIG. 3A, a second exemplary view of the first clock signal dividing block 40, a first clock signal dividing block 40b can have a configuration similar to the first clock signal dividing block 40a shown in FIG. 2A, but is different in that it can operate in response to a test signal "tst".

That is, the first clock signal dividing block 40b can include a first clock signal synchronizing unit 410b, a first clock signal dividing unit 420b, and a first switching unit 430b. The first clock signal synchronizing unit 410b can include a first inverter IV1b, a second inverter IV2b, a third inverter IV3b, a first pass gate PG1b, and a first control inverter CIV1b. The switching unit 430b includes a fourth inverter IV4b, a first NAND gate ND1b, a second NAND gate ND2b, and a third NAND gate ND3b.

The first switching unit 430 can further include a first NOR gate NR1 that can receive the first clock signal synchronization lock completion signal "lock_syn1" that can be output from the first clock signal synchronizing unit 410b and the test signal "tst", and a fifth inverter IV5b that can invert an output signal of the first NOR gate NR1 and can transmit the inverted signal to signal input terminals of the fourth inverter IV4b and the second NAND gate ND2b.

According to this configuration, when the test signal "tst" is enabled in a test mode, the first clock signal dividing block 40b can output only the first divide clock signal "clk_div1", regardless of whether the lock completion signal "lock" is enabled. Therefore, it is easy to test the operation using the divided clock signals. According to circumstances, the test signal "tst" may be locked by a fuse circuit or a mode register set.

Figure 3B:
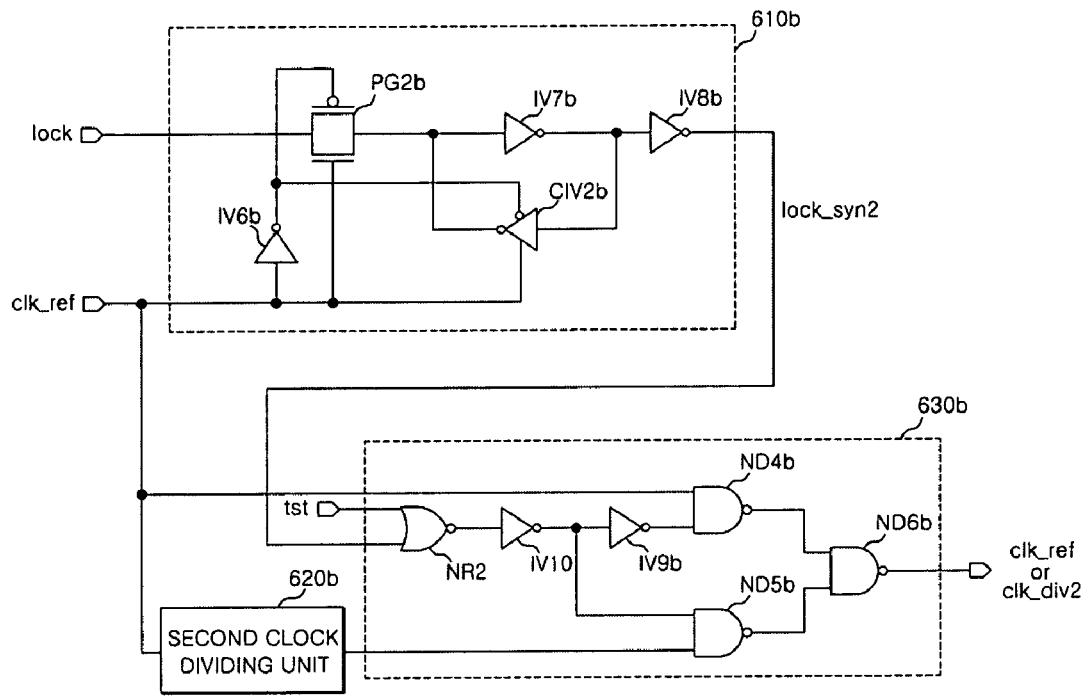
FIG. 3B is a second exemplary view illustrating a detailed configuration of the second clock signal dividing block that can be included in the diagram illustrated in FIG. 1.

Referring to FIG. 3B, a second exemplary view of the second clock signal dividing block 60, a second clock signal dividing block 60b can have a configuration similar to the second clock signal dividing block 60a shown in FIG. 2B, but is different in that it operates in response to a test signal "tst".

That is, the second clock signal dividing block 60b can include a second clock signal synchronizing unit 610b, a second clock signal dividing unit 620b, and a second switching unit 630b. The second clock signal synchronizing unit 610b can include a sixth inverter IV6b, a seventh inverter IV7b, an eighth inverter IV8b, a second pass gate PG2b, and a second control inverter CIV2b. The second switching unit 630b can include a ninth inverter IV9b, a fourth NAND gate ND4b, a fifth NAND gate ND5b, and a sixth NAND gate ND6b.

The second switching unit 630b can further include a second NOR gate NR2 that can receive a second clock signal synchronization lock completion signal "lock_syn2" that can be output from the second clock signal synchronizing unit 610b and the test signal "tst", and a tenth inverter IV10 that can invert an output signal of the second NOR gate NR2 and can transmit the inverted signal to signal input terminals of the ninth inverter IV9b and the fourth NAND gate ND4b.

According to this configuration, when the test signal "tst" is enabled in a test mode, the second clock signal dividing block 60 can output only the second divide clock signal "clk_div2", regardless of whether the lock completion signal "lock" is enabled. Therefore, it is easy to test the operation using the divide clock signals.

Figure 4:
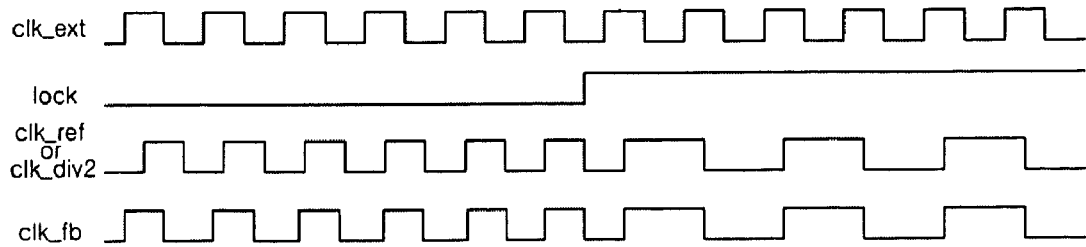
FIG. 4 is a timing diagram illustrating an operation of the DLL circuit in FIG. 1.

FIG. 4 is a timing diagram illustrating the operation of the DLL circuit shown in FIG. 1, in which it is assumed that the frequencies of the first divide clock signal "clk_div1" and the second divide clock signal "clk_div2" are half of the frequencies of the reference clock signal "clk_ref" and the feedback clock signal "clk_fb", respectively.

The external clock signal "clk_ext", the lock completion signal "lock", and input clock signals of the phase comparing block 70 are shown in the figure. In the disabled section of the lock completion signal "lock", the input clock signals of the phase comparing block 70 can each be the reference clock signal "clk_ref" and the feedback clock signal "clk_fb". The feedback clock signal "clk_fb" can be generated by the delay clock signal "clk_dly", not the first divide clock signal "clk_div1". The phase difference of the reference clock signal "clk_ref" and the feedback clock signal "clk_fb" can be gradually decreased and then the lock completion signal "lock" can become enabled.

In the enabled section of the lock completion signal "lock", the input clock signals of the phase comparing block 70 can each be the second divide clock signal "clk_div2" and the feedback clock signal "clk_fb", and the feedback clock signal "clk_fb" can be generated by the first divide clock signal "clk_div1", not the delay clock signal "clk_dly".

As described above, the DLL circuit, according to an embodiment described herein, can operate using high-frequency clock signals before the delay lock is completed, and then can operate using the clock signals divided from the high-frequency clock signals after the delay lock is completed. Therefore, it is possible to prevent the time taken to the delay lock from increasing and reduce power consumption after the delay lock is completed. Further, it is possible to considerably improve the stability in the operation of the DLL circuit by reducing possibility of an erroneous operation due to using the high-frequency clock signals.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A DLL circuit comprising:
   a first clock signal dividing block configured to selectively divide a frequency of a delay clock signal according to whether a lock completion signal is enabled;
   a delay compensating block configured to generate a feedback clock signal by delaying a clock signal transmitted from the clock signal dividing block, for a predetermined time; and
   an operation mode setting block configured to generate the lock completion signal according to information of phases of a reference clock signal and the feedback clock signal,
   wherein the first clock signal dividing block is configured to transmit the delay clock signal to the delay compensating block when the lock completion signal is disabled, and when the lock completion signal is enabled, to generate a first divide clock signal by dividing the frequency of the delay clock signal according to a predetermined divide ratio and to transmit the first divide clock signal to the delay compensating block, and the delay compensating block is configured to generate the feedback clock signal by delaying the delay clock signal when the lock completion signal is disabled, and to generate the feedback clock signal by delaying the first divide clock signal when the lock completion signal is enabled.

2. The DLL circuit of claim 1, wherein the first clock signal dividing block includes:
   a clock signal synchronizing unit configured to generate a clock signal synchronization lock completion signal by synchronizing the lock completion signal with the delay clock signal;
   a clock signal dividing unit, configured to generate the first divide clock signal by dividing the frequency of the delay clock signal according to a predetermined divide ratio; and
   a switching unit configured to selectively output the delay clock signal or the first divide clock signal according to whether the clock signal synchronization lock completion signal is enabled.

3. The DLL circuit of claim 2, wherein the switching unit further includes a circuit configured to selectively output the delay clock signal or the first divide clock signal in response to a test signal.

4. The DLL circuit of claim 1, wherein the operation mode setting block is configured to keep the lock completion signal disabled when the phase difference of the reference clock signal and the feedback clock signal exceeds a predetermined range, and to enable the lock completion signal when the phase difference of the reference clock signal and the feedback clock signal does not exceed a predetermined range.

5. The DLL circuit of claim 1, further comprising:
   a phase comparing block configured to generate a phase comparison signal by comparing phases of the reference clock signal with the feedback clock signal and to transmit the phase comparison signal to the operation mode setting block;
   a delay control block configured to generate a delay control signal in response to the phase comparison signal and the lock completion signal; and
   a delay block configured to generate a delay clock signal by delaying the reference clock signal in response to the delay control signal.

6. The DLL circuit of claim 5, further comprising:
   a second clock signal dividing block configured to generate a second divide clock signal by dividing the frequency of the reference clock signal and to selectively transmit the reference clock signal or the second divide clock signal to the phase comparing block, according to whether the lock completion signal is enabled.

* * * * *